(12) United States Patent
Nakanishi et al.

(10) Patent No.: US 10,182,190 B2
(45) Date of Patent: Jan. 15, 2019

(54) LIGHT DETECTING APPARATUS, IMAGE CAPTURING APPARATUS AND IMAGE SENSOR

(71) Applicant: NIKON CORPORATION, Tokyo (JP)

(72) Inventors: Sota Nakanishi, Kawasaki (JP); Wataru Funamizu, Yokohama (JP); Kazuya Okamoto, Yokohama (JP); Shiro Tsunai, Kawasaki (JP); Isao Sugaya, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/590,732

(22) Filed: May 9, 2017

(65) Prior Publication Data
US 2017/0302859 A1 Oct. 19, 2017

Related U.S. Application Data

(63) Continuation of application No. PCT/JP2015/081646, filed on Nov. 10, 2015.

(30) Foreign Application Priority Data

Nov. 10, 2014 (JP) .................................. 2014-228475

(51) Int. Cl.
*H04N 5/243* (2006.01)
*H01L 27/14* (2006.01)
(Continued)

(52) U.S. Cl.
CPC ............. *H04N 5/243* (2013.01); *H01L 27/14* (2013.01); *H01L 27/14634* (2013.01);
(Continued)

(58) Field of Classification Search
CPC .......................... H04N 5/243; H04N 5/3745; H01L 27/14627; H01L 27/14621;
(Continued)

(56) References Cited

U.S. PATENT DOCUMENTS 5,705,807 A * 1/1998 Throngnumchai ......................... H01L 27/14609 250/214 B
6,040,568 A * 3/2000 Caulfield ............... H04N 5/365 250/208.1

(Continued)

FOREIGN PATENT DOCUMENTS

JP  H05-173058 A  7/1993
JP  H11-84003 A   3/1999
(Continued)

OTHER PUBLICATIONS

Dec. 15, 2015 Search Report issued in International Patent Application No. PCT/JP2015/081646.
(Continued)

*Primary Examiner* — Jason A Flohre
(74) *Attorney, Agent, or Firm* — Oliff PLC

(57) ABSTRACT

Provided is a light detecting apparatus including: a first photoelectric converting element which outputs a first electrical signal in accordance with an incident light including a modulated light component and a background light component; a filter which outputs a second electrical signal resulting from the modulated light component being reduced in the incident light; and a signal processor which subtracts the second electrical signal from the first electrical signal to reduce a component corresponding to the background light component in the first electrical signal.

18 Claims, 20 Drawing Sheets

(51) Int. Cl.
*H04N 5/3745* (2011.01)
*H04N 5/235* (2006.01)
*H01L 27/146* (2006.01)

(52) U.S. Cl.
CPC .. *H01L 27/14636* (2013.01); *H01L 27/14645* (2013.01); *H04N 5/2357* (2013.01); *H04N 5/3745* (2013.01); *H01L 27/14621* (2013.01); *H01L 27/14627* (2013.01)

(58) Field of Classification Search
CPC ......... H01L 27/14636; H01L 27/14645; H01L 27/14634
See application file for complete search history.

(56) References Cited

U.S. PATENT DOCUMENTS

| | | | | |
|---|---|---|---|---|
| 6,084,229 | A * | 7/2000 | Pace | H04N 5/3575 250/208.1 |
| 6,226,076 | B1 | 5/2001 | Yoshida | |
| 6,256,067 | B1 * | 7/2001 | Yamada | H04N 5/2354 348/229.1 |
| 6,597,465 | B1 * | 7/2003 | Jarchow | G06K 1/121 235/462.01 |
| 7,315,324 | B2 * | 1/2008 | Cleveland | H04N 5/23254 348/208.4 |
| 2010/0097501 | A1 * | 4/2010 | Fowler | H04N 5/361 348/241 |
| 2014/0198183 | A1 * | 7/2014 | Kim | H04N 5/3745 348/46 |
| 2015/0365617 | A1 * | 12/2015 | Chen | H04N 5/3745 348/302 |
| 2016/0142657 | A1 * | 5/2016 | Caulfield | H04N 5/37452 348/308 |
| 2017/0112448 | A1 * | 4/2017 | Liu | A61B 5/725 |

FOREIGN PATENT DOCUMENTS

| | | |
|---|---|---|
| JP | 2002-502980 A | 1/2002 |
| WO | 99/40536 A1 | 8/1999 |

OTHER PUBLICATIONS

May 16, 2017 International Preliminary Report on Patentability issued in International Patent Application No. PCT/JP2015/081646.
May 15, 2018 Office Action issued in Japanese Application No. 2016-559069.

* cited by examiner

LIGHT DETECTING APPARATUS, IMAGE CAPTURING APPARATUS AND IMAGE SENSOR

The contents of the following Japanese patent application(s) are incorporated herein by reference:
NO. 2014-228475 filed on Nov. 10, 2014 and
NO. PCT/JP2015/081646 filed on Nov. 10, 2015.

BACKGROUND

1. Technical Field

The present invention relates to a light detecting apparatus, an image capturing apparatus and an image sensor.

2. Related Art

There is a circuit which removes background components included in a received light signal by an alternate current connection and inputs the signal to a lock-in amplifier (for example, refer to Patent document 1).

[Patent document 1] Japanese Translation of PCT International Application Publication No. 2002-502980

Restrictions on a capacity of a capacitative element which may be used for the alternate current connection may result in an insufficient gain of the amplifier.

SUMMARY

In a first aspect of the present invention, provided is an image capturing device including: a first photoelectric converting unit which outputs a first electrical signal in accordance with an incident light including a modulated light component and a background light component; a second photoelectric converting unit which outputs a second electrical signal resulting from the modulated light component being reduced in the incident light; and a signal processor which subtracts the second electrical signal from the first electrical signal to reduce a component corresponding to the background light component in the first electrical signal.

In a second aspect of the present invention, provided is an image capturing apparatus including: the image capturing device; and an image formation optical system which causes the image capturing device to form an image with an imaging light.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments described below are not to limit the claimed invention. All of the combinations of the features described in the embodiments are not necessarily essential for means of the invention.

Figure 1:
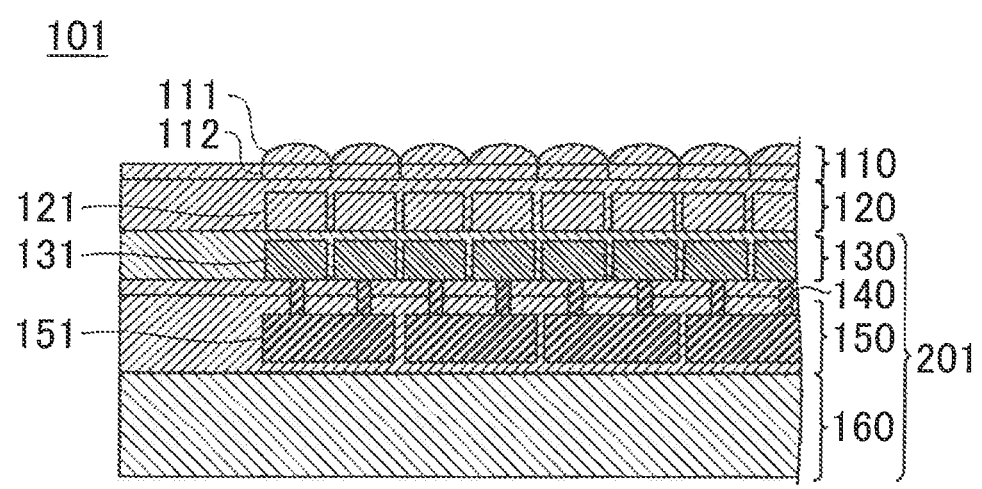
FIG. 1 is a schematic cross sectional view of an image capturing device 101.

FIG. 1 is a schematic cross sectional view of an image capturing device 101. The image capturing device 101 includes a support substrate 160, a detection processing substrate 150, a detection light receiving substrate 130, a connecting substrate 140, an image-capturing light receiving substrate 120, and an optical element layer 110 which are stacked sequentially from the lower side in the figure. The substrates other than the optical element layer 110 are stacked and joined with one another after being manufactured individually by photolithography, respectively.

The support substrate 160 is a base which remains at the original position after it was used for forming the detection processing substrate 150. However, it may be thinner than it was by grinding and the like, depending on the application. Also, the support substrate 160 may be provided with, for example, a TSV which penetrates therethrough and a bump provided on a lower surface of the support substrate 160 in the figure.

The detection processing substrate 150 includes a detecting circuit 151 including an element layer, a wiring layer and the like. A plurality of detecting circuits 151 are arranged in a surface direction of the detection processing substrate 150. The connecting substrate 140 mechanically couples, and also electrically couples the detection processing substrate 150 immediately under the connecting substrate 140 and the detection light receiving substrate 130 immediately on the connecting substrate 140. Furthermore, the connecting substrate 140 may include a passive element embedded therein and used by the detecting circuit 151, such as a capacitative element and a resistor element.

The detection light receiving substrate 130 includes a plurality of detection light receiving elements 131 to form a photoelectric converting unit. Each of the detection light receiving elements 131 receives an incident light which is transmitted through the optical element layer 110 and the image-capturing light receiving substrate 120 and enters the light receiving element, and outputs an electrical signal in accordance with an intensity of the incident light. Each of the detection light receiving elements 131 is connected to the detecting circuit 151 of the detection processing substrate 150 through a wiring and elements formed to penetrate through the connecting substrate 140. This allows the electrical signals output from the detection light receiving elements 131 to be input to the detecting circuit 151 of the detection processing substrate 150.

The image-capturing light receiving substrate 120 includes a plurality of image-capturing light receiving elements 121. When an image is captured by the image capturing device 101, an image of the subject is formed on a surface on which the image-capturing light receiving elements 121 are arrayed. The optical element layer 110 includes, for example, an on-chip color filter 112 and an on-chip lens 111 to optically process an incident light which enters the image-capturing light receiving elements 121 in advance. The optical element layer 110 is formed by stacking and processing optical material after other substrates are stacked.

Figure 2:
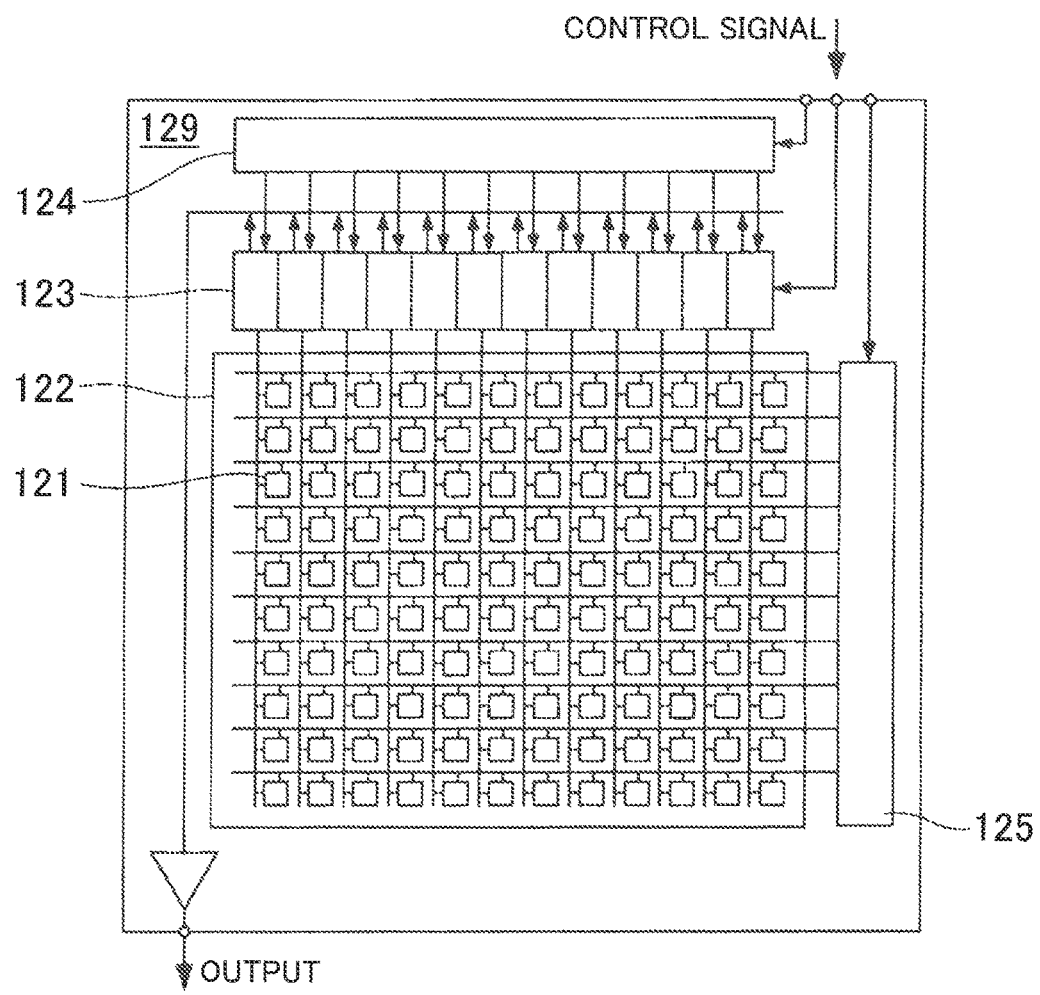
FIG. 2 is a schematic plan view of the CMOS sensor unit 129.

FIG. 2 is a schematic plan view of a CMOS sensor unit 129 which includes image-capturing light receiving elements 121 and is formed on the image-capturing light receiving substrate 120. The CMOS sensor unit 129 includes a sensor array 122, a column signal processing circuit 123, a horizontal driving circuit 124, and a vertical driving circuit 125 and is operated in response to a control signal fed from the outside.

The sensor array 122 includes a plurality of image-capturing light receiving elements 121 arrayed in a matrix. Each of the image-capturing light receiving elements 121 forms a unit pixel in an image sensor with a plurality of transistors.

The vertical driving circuit 125 is provided along one side of columns of the sensor array 122. The column signal processing circuit 123 and the horizontal driving circuit 124 are provided along a side orthogonal to the side along which the vertical driving circuit 125 is provided. The vertical driving circuit 125 is connected to each row of the image-capturing light receiving elements 121 at one end of a plurality of driving lines provided horizontally in the figure.

The vertical driving circuit 125 includes a shift register and feeds pulse signals to select a plurality of connected driving lines sequentially and drive the image-capturing light receiving elements 121 to the selected driving line. This allows the image-capturing light receiving elements 121 to be selectively scanned sequentially row by row in a vertical direction.

The column signal processing circuit 123 includes, for example, a double correlation sampling circuit, a load transistor, and a column selecting transistor, and is connected to the image-capturing light receiving elements 121 for each column. The horizontal driving circuit 124 is formed by the shift register, for example, and connected to the column selecting transistor in the column signal processing circuit 123. The horizontal driving circuit 124 drives the column selecting transistor of the column signal processing circuit 123 sequentially to selectively scan the image-capturing light receiving elements 121 for each column sequentially through the column signal processing circuit 123.

In the row selectively driven by the vertical driving circuit 125, the image-capturing light receiving elements 121 selectively driven by the horizontal driving circuit 124 output to the column signal processing circuit 123 voltage signals in accordance with electrical charges accumulated in a floating diffusion layer. The column signal processing circuit 123 outputs electrical signals in accordance with the intensity of the incident light entering the image-capturing light receiving elements 121, after removing influences of pattern noises by double correlation sampling. This results in electrical signals reflecting a light image formed on a light receiving surface of the sensor array 122 to be output to an external apparatus such as a storage apparatus and a display apparatus.

Figure 3:
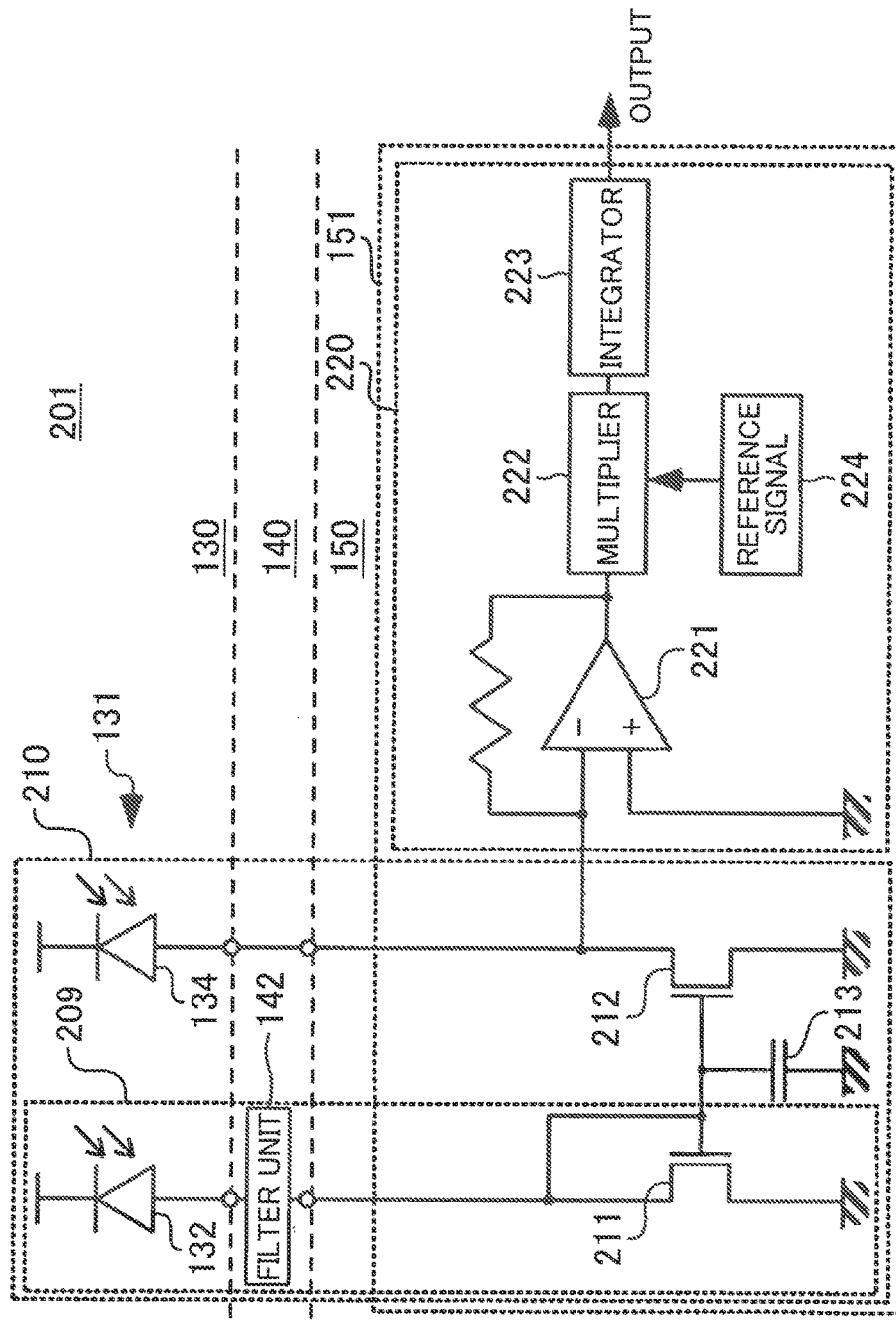
FIG. 3 is a circuit diagram of the modulation signal detecting unit 201.

FIG. 3 is a circuit diagram showing a configuration of a modulation signal detecting unit 201 in the image capturing device 101. The modulation signal detecting unit 201 includes a modulated light detecting unit 210 and a lock-in amplifying unit 220.

The modulated light detecting unit 210 includes detection light receiving elements 131 including main pixels 134 and sub pixels 132 provided in the detection light receiving substrate 130, a filter unit 142 provided in the connecting substrate 140, and a pair of transistors 211, 212 provided in the detection processing substrate 150 to detect a modulated light component included in an incident light entering the image capturing device 101. The modulated light component has an intensity which varies at a predetermined frequency. The sub pixel 132 and the main pixel 134 may be provided in the common detection light receiving substrate 130.

The sub pixel 132 is formed by photoelectric converting elements such as photodiodes and flows currents in accordance with the intensity of the received incident light. The filter unit 142 is formed, for example, by using a parasitic capacitance of a TSV as capacitative elements and connected to the sub pixel 132 at one end, where the TSV is formed to penetrate the connecting substrate 140 which is stacked to electrically connect the detection light receiving substrate 130 and the detection processing substrate 150.

The filter unit 142 blocks or reduces a preset bandwidth component. The filter unit 142 may also include a TSV and elements of a high resistance or a high capacity formed of polysilicon and the like in the connecting substrate 140. The drain of one transistor 211 is connected to the other end of the filter unit 142. Also, for the transistor 211, the drain and the gate are shorted.

The main pixel 134 is formed by photoelectric converting elements such as photodiodes and flows currents in accordance with the intensity of the received incident light. The drain of the other transistor 212 is connected to an output of the main pixel 134 and an input of the lock-in amplifying unit 220. Also, the gate of the transistor 212 is connected to the gate of one transistor 211. Note that the parasitic capacitance 213 exists between the gates of a pair of transistors 211, 212.

Figure 4:
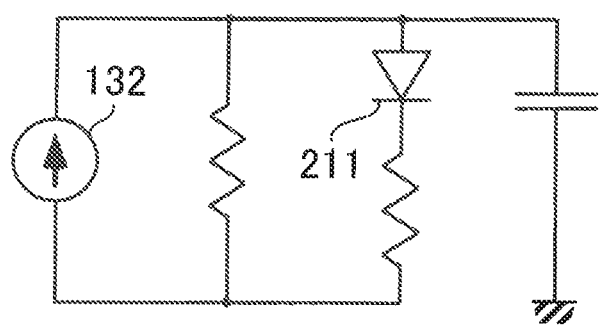
FIG. 4 is a circuit diagram showing an equivalent circuit of a background light detecting unit 209.

FIG. 4 is a circuit diagram showing an equivalent circuit of a background light detecting unit 209. The background light detecting unit 209 configures a part of the modulated light detecting unit 210 as surrounded by dotted lines shown in FIG. 3 and detects a background light component included in an incident light entering the image capturing device 101. Here, the background light component is a light component other than the modulated light component which includes a light component varying at a frequency different from a frequency of the modulated light component. The background light component is derived from an environment light fed from a light source such as the sun and lighting fixtures, and includes the one which enters the image capturing device 101 directly from the light source and the one which enters after being reflected on the subject or the like.

The background light detecting unit 209 is formed to include elements to form the filter unit 142, in addition to the sub pixel 132 and the transistor 211. In the background light detecting unit 209, the sub pixel 132 functions as a current source and the transistor 211 forms a current mirror circuit.

Referring again to FIG. 3, the lock-in amplifying unit 220 in the modulation signal detecting unit 201 of the image capturing device 101 includes an operational amplifier 221, a multiplier 222, and an integrator 223 provided on the detection processing substrate 150. The operational amplifier 221 receives an output of the modulated light detecting unit 210 at an inverting input. Also, a non-inverting input and an output of the operational amplifier 221 are coupled by a resistor element. This allows the operational amplifier 221 to be operated as a current-voltage converter.

The multiplier 222 configures a mixer which multiplies the output of the operational amplifier 221 by a reference signal 224. The reference signal 224 input to the multiplier 222 is modulated at the same modulation frequency as the modulation frequency of the modulated light signal to be a detection target. The integrator 223 is formed of a low pass filter, for example, and performs an integration processing on the output signal of the multiplier 222. In this manner, in the light signal received by the modulated light detecting unit 210, the modulated light component modulated at the same frequency as the frequency of the reference signal 224, is output from the modulation signal detecting unit 201. This allows a signal of the modulated light component included in the incident light received by the image capturing device 101 to be obtained, on which the phase difference from the reference signal 224 or the amplitude (intensity) is reflected.

Figure 5:
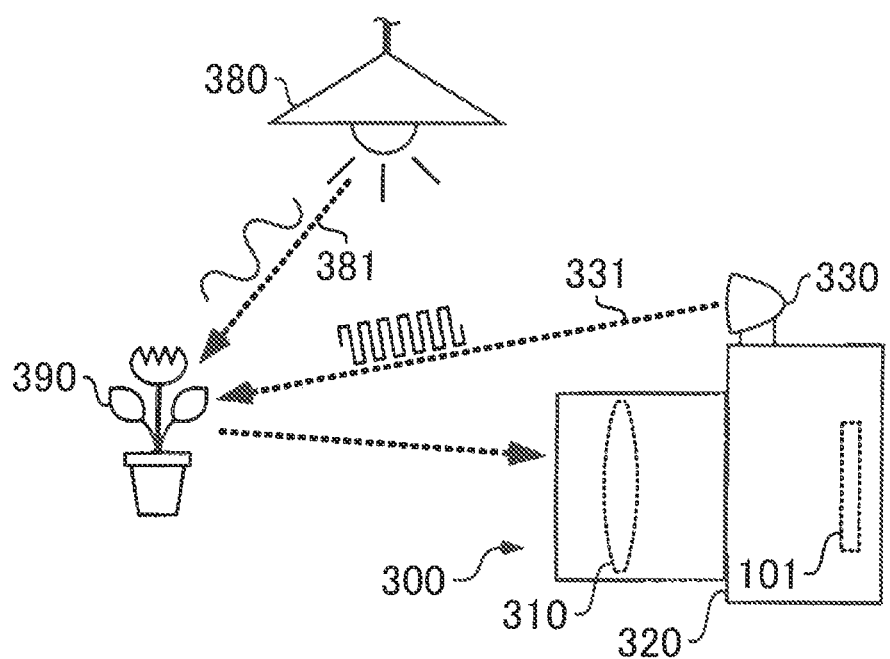
FIG. 5 is a schematic view of an image capturing apparatus 300.

FIG. 5 is a schematic view of an image capturing apparatus 300 including the image capturing device 101. The image capturing apparatus 300 includes an image capturing lens 310, a camera body 320, and an irradiating unit 330.

The image capturing lens 310 is mounted on the camera body 320 which houses the image capturing device 101. When the image capturing lens 310 is focused to a subject 390, an image of the subject is formed on an image capturing surface of the CMOS sensor unit 129 in the image-capturing light receiving substrate 120 of the image capturing device 101. Thus, the image of the subject 390 can be captured by recording an electrical signal output by the CMOS sensor unit 129. Note that the image capturing includes at least one of a recording operation of a still image and a recording operation of a motion image of the subject 390.

The irradiating unit 330 irradiates the subject 390 with a modulated light 331 modulated at a predetermined modulation frequency. After reflected on the subject 390, the modulated light 331 with which the subject 390 is irradiated enters the image capturing device 101 of the image capturing apparatus 300 as a reflected light.

In the image capturing apparatus 300, when the image capturing device 101 receives the modulated light 331 output from the irradiating unit 330, it measures a length of time from when the received modulated light 331 was output from the irradiating unit 330 until it is detected by the modulated light detecting unit 210. This allows for calculation of a distance between the subject 390 and the image capturing device 101. Furthermore, the image capturing apparatus 300 can focus the image capturing lens 310 in accordance with the calculated distance.

Note that in the environment in which the illustrated subject 390 is placed, the subject 390 is illuminated by the illumination light 381 output from a lighting fixture 380 in the room. Also, if the image capturing of the subject 390 by the image capturing apparatus 300 is performed in the daytime, the subject 390 is also irradiated with the sunlight directly or indirectly. Therefore, in the image capturing apparatus 300, a background light component of, for example, the illumination light 381 and the sunlight which are different from the component of the modulated light 331 output from the irradiating unit 330 also enters the image capturing device 101.

Here, the sunlight which may be included in the background light component may vary continuously, even at a period longer than the modulation frequency of the modulated light component. Also, the illumination light 381 may also vary periodically in accordance with a frequency of an alternate current source. Furthermore, if something moves around the subject 390, the intensity of the light with which the subject 390 is irradiated varies, even if it is not the light source. Therefore, if the modulation component and the background light component enter the image capturing device 101 together, detection accuracy of the modulated light component by the modulated light detecting unit 210 may be affected.

Figure 6:
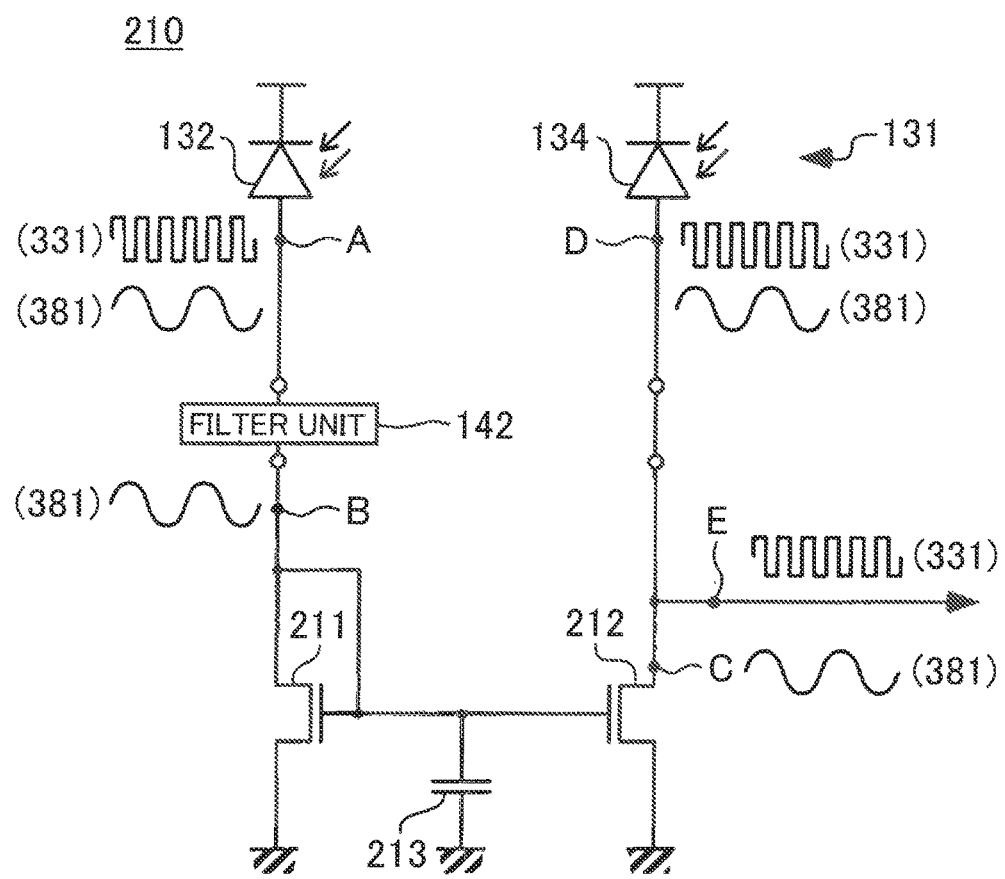
FIG. 6 is a diagram illustrating an operation of the modulated light detecting unit 210.

FIG. 6 is a diagram illustrating an operation of the modulated light detecting unit 210. An incident light including the modulated light 331 and a background light such as the illumination light 381 enters a pair of detection light receiving elements 131. Thus, through a node A and a node D shown in the figure, a current signal flows which varies in accordance with both components of a modulation component corresponding to the modulated light 331 and a background light component corresponding to the illumination light 381.

The filter unit 142 is connected to the output of the sub pixel 132. Therefore, through the node B connected to the drain of the transistor 211 through the filter unit 142, a current flow having a waveform in which the modulation component is removed or reduced.

Because a pair of transistors 211, 212 forms a current mirror circuit, a current from which the modulation component is removed also flows through the node C connected to the drain of the transistor 212. This allows for a current signal having a waveform in which the background light component is reduced or removed being output to a node E branched from between the main pixel 134 and the transistor 212.

In this manner, in the modulated light detecting unit 210 of the image capturing device 101, an electrical signal resulting from a current signal corresponding to the modulation component being reduced in a current signal corresponding to the incident light is output in the background light detecting unit 209 which includes the sub pixel 132. Furthermore, the current mirror circuit causes the current signal output by the background light detecting unit 209 to be subtracted from the current signal output by the main pixel 134.

This allows a current signal which corresponds to the incident light and from which the background light component corresponding to the background light is removed or reduced to be input to the lock-in amplifying unit 220 of the modulation signal detecting unit 201. Note that it is preferable that the light receiving area ratio of the sub pixel 132 and the main pixel 134 and the size ratio of the transistors 211, 212 should be equalized, respectively, in view of the operation of the modulated light detecting unit 210. This allows the background light component to be removed or reduced in the output of the modulated light detecting unit 210 with a high accuracy.

Figure 7:
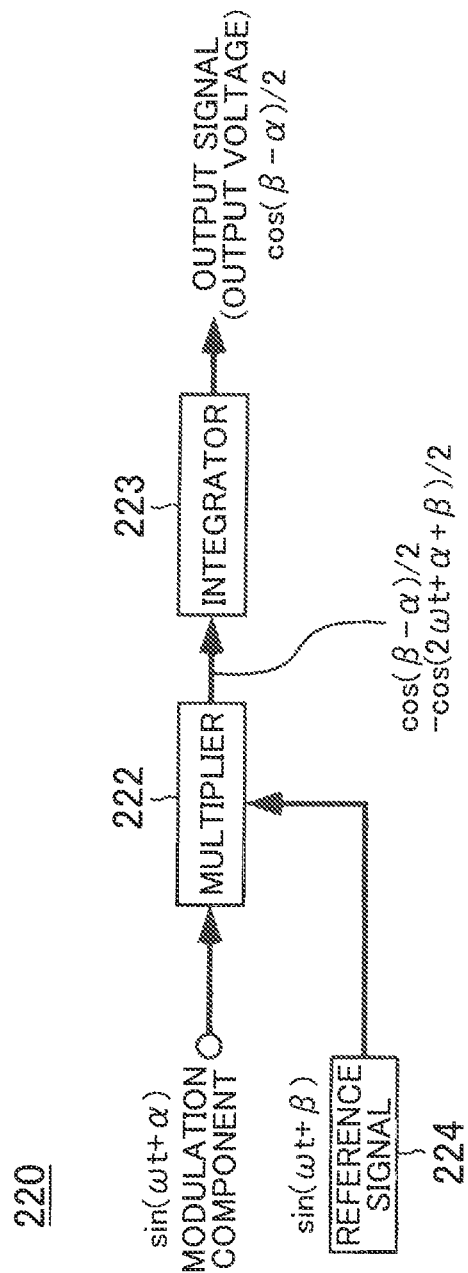
FIG. 7 is a diagram illustrating an operation of the lock-in amplifying unit 220.

FIG. 7 is a diagram illustrating an operation of the lock-in amplifying unit 220. As described above, the background light component is removed or reduced in the input signal to the lock-in amplifying unit 220. Thus, the modulation component modulated at a modulation frequency at of the modulated light 331 is input to the multiplier 222.

The reference signal 224 input to the multiplier 222 is modulated at the same modulation frequency (t as the modulated light 331. Thus, $\cos(\beta-\alpha)/2-\cos(2\omega t+\alpha+\beta)/2$ is output from the multiplier 222. This is processed in the integrator 223 so that a signal corresponding to $\cos(\alpha-\beta)/2$ is output.

This varies a signal level of a direct current signal output by the integrator 223 in accordance with a phase difference between the modulated light 331 which enters the modulated light detecting unit 210 and the reference signal 224. Thus, based on the phase difference corresponding to the signal level, it is possible to calculate a travel time of the modulated light 331 from when it was output from the irradiating unit 330 and reflected on the subject 390 until it reaches the image capturing device 101.

In this manner, the modulation signal detecting unit 201 of the image capturing device 101 can be used as a range finder to measure a distance between the image capturing device 101 and the subject 390. Thus, in the image capturing apparatus 300, the image capturing lens 310 can be focused based on the output of the modulation signal detecting unit 201. Furthermore, the image capturing device 101 can capture an image of the subject 390 with the CMOS sensor unit 129 provided on the image-capturing light receiving substrate 120.

Figure 8:
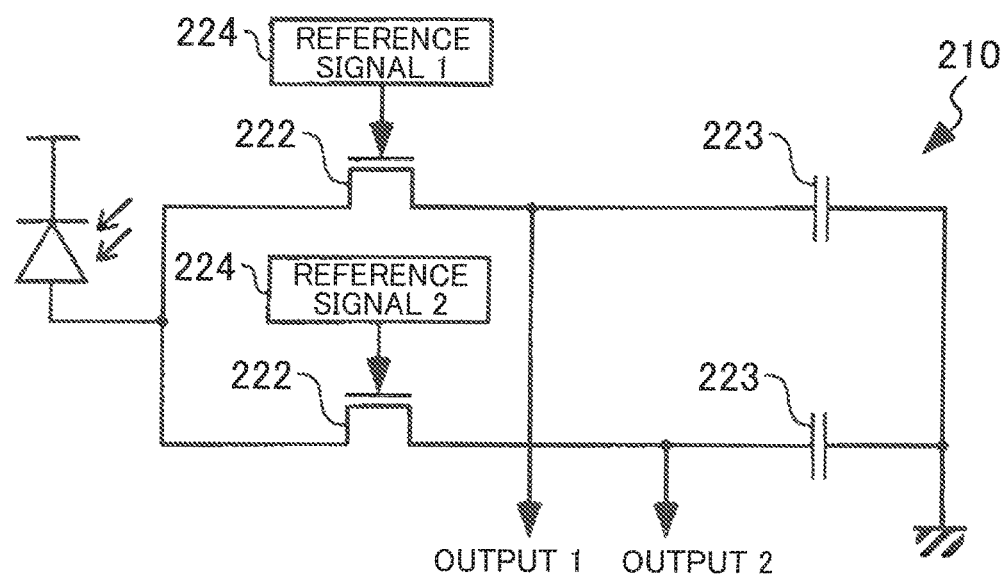
FIG. 8 is a diagram showing an exemplary circuit of the lock-in amplifying unit 220.

FIG. 8 is a diagram showing an exemplary circuit of the lock-in amplifying unit 220. The illustrated circuit includes a pair of transistors which receives the modulation component detected by the modulated light lock-in amplifying unit 220 at the drain and a pair of capacitive elements connected to the source of each transistor. The transistor receives the reference signal 224 at the gate to form the multiplier 222 which multiplies the modulation component by the reference signal. The capacitive element functions as a low pass filter to form the integrator 223 which accumulates electrical charges in proportion to an integrated value of the outputs of the multiplier 222.

Here, a reference signal 1 and a reference signal 2 input to a pair of multipliers 222 are out of phase with each other by 180 degrees. Thus, electrical charges accumulated in a pair of integrators 223 are read out by a pixel amplifier of a source follower or the like and subtracted so that the phase shifting against the reference signal of the received modulation component is detected. This allows the illustrated lock-in amplifying unit 220 to detect the phase difference of the modulation component against the reference signal synchronized to the modulation component.

Figure 9:
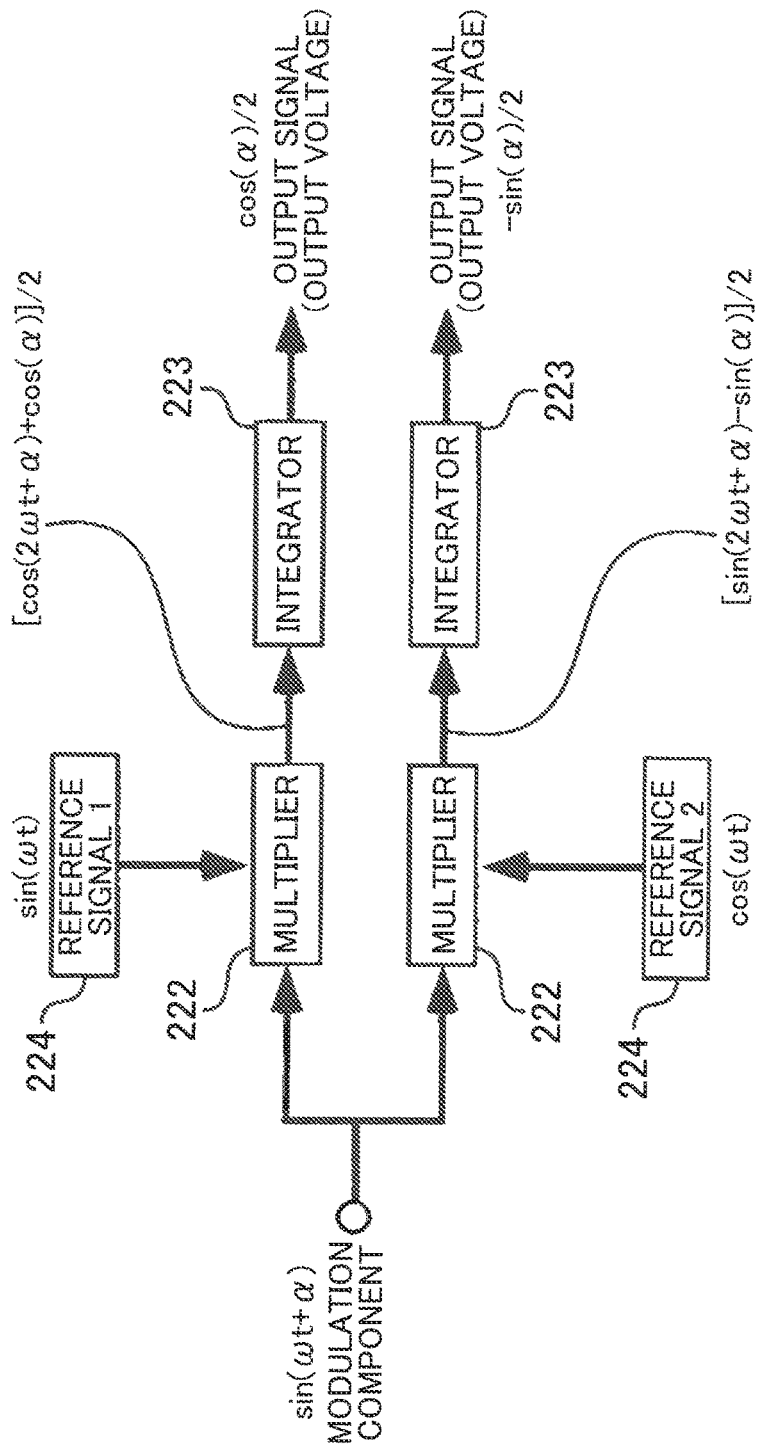
FIG. 9 is a diagram illustrating an operation of the lock-in amplifying unit 220.

FIG. 9 is a diagram illustrating an operation of the lock-in amplifying unit 220 described above. The illustrated lock-in amplifying unit 220 includes two systems of the multiplier 222 and the integrator 223 for the modulation component. In a pair of multipliers 222, the reference signal 1 [$\sin(\omega t)$] and the reference signal 2 [$\cos(\omega t)$]orthogonal to each other are multiplied by the modulation component of the incident light.

[$\{\cos(2\omega t+\alpha)+\cos(\alpha)\}/2$] is output from one multiplier 222 while [$\{\sin(2\omega t+\alpha)-\sin(\alpha)\}/2$] is output from the other multiplier 222, respectively. As an integration processing id performed on each output by an integration processing of the integrator 223, [$\cos(\alpha)/2$] and [$-\sin(\alpha)/2$] is output from the output of the lock-in amplifying unit 220. By calculating $\tan(\alpha)$ from these values, the phase difference of the reference signal for the modulate signal is directly calculated.

The lock-in amplifying unit 220 as described above can detect and correct the phase difference between the modulation component of the received incident light and the reference light to increase sensitivity to detect the modulation component of the incident light. Also, it can output the phase difference directly so that load on the computation unit is reduced and a distance to the image capturing target or the like is rapidly calculated. Note that the lock-in amplifiers 220 may be provided for each of a plurality of detection light receiving elements 131 or each of a plurality of main pixels 134, individually, or a single lock-in amplifying unit 220 may be provided for a plurality of detection light receiving elements 131 or a plurality of main pixels 134.

In the example in FIG. 9, a detecting unit including at least one of the multiplier 222 to which the reference signal 1 is input and the integrator 223 connected to this multiplier 222 and a detecting unit including at least one of the multiplier 222 to which the reference signal 2 is input and the integrator 223 connected to this multiplier 222 may be provided on different substrates stacked one above the other, respectively, or may be provided on the same substrate.

Also, in the example in FIG. 9, the lock-in amplifying unit 220 may also include a first system including the detecting unit described above to detect the reflected light of the reference signal 1 reflected on the subject 390 and a second system including the detecting unit described above to detect the reflected light of the reference signal 2 having a modulation frequency different from that of the reference signal 1 and reflected on the subject 390. For example, the reference signal 2 has a modulation frequency lower than the reference signal 1. Therefore, the phase shifting of the reflected lights allows the first system and the second system to have different periodicities for calculating the distance between the subject 390 and the image capturing device 101. Given that the distance is detected by the second system with a long period, the first system calculates a distance with a high accuracy, thereby achieving both of a broader scope of an absolute distance to be calculated and accuracy of a distance to be detected.

If two detecting units are provided on different substrates stacked one above the other, the substrate provided with the detecting unit to which the reference signal 1 is input is arranged in a layer closer to the image-capturing light receiving substrate 120 than the substrate provided with the detecting unit to which the reference signal 2 is input having a modulation frequency lower than the modulation frequency of the reference signal 1. Also, these detecting unite may also be provided on the same substrate.

Furthermore, where a wavelength of the modulation component of the reference signal 1 is $\lambda 1$, a ranging accuracy of the first modulation component by the reference signal 1 is $\delta 2$, a ranging value of the second modulation component by the reference signal 2 is $\Delta 2$, and an arbitrary positive integer is n, a combination may be selected to uniquely determine n to satisfy an expression of [$\Delta 2-\delta 2 < n\lambda 1 < \Delta 2+\delta 2$] for the first modulation frequency and the second modulation frequency. This allows the distance to the subject 390 from the image capturing device 101 to be determined by one ranging operation so that the ranging operation is completed in a short time.

Also, in the example described above, an exemplary case is illustrated in which each of the reference signal 1 and the reference signal 2 is used for distance detection. Instead, one of the reference signal 1 and the reference signal 2 may be used for distance detection while the other may be used for forming images. Alternatively, two reference signals may be used for forming images, respectively.

Figure 10:
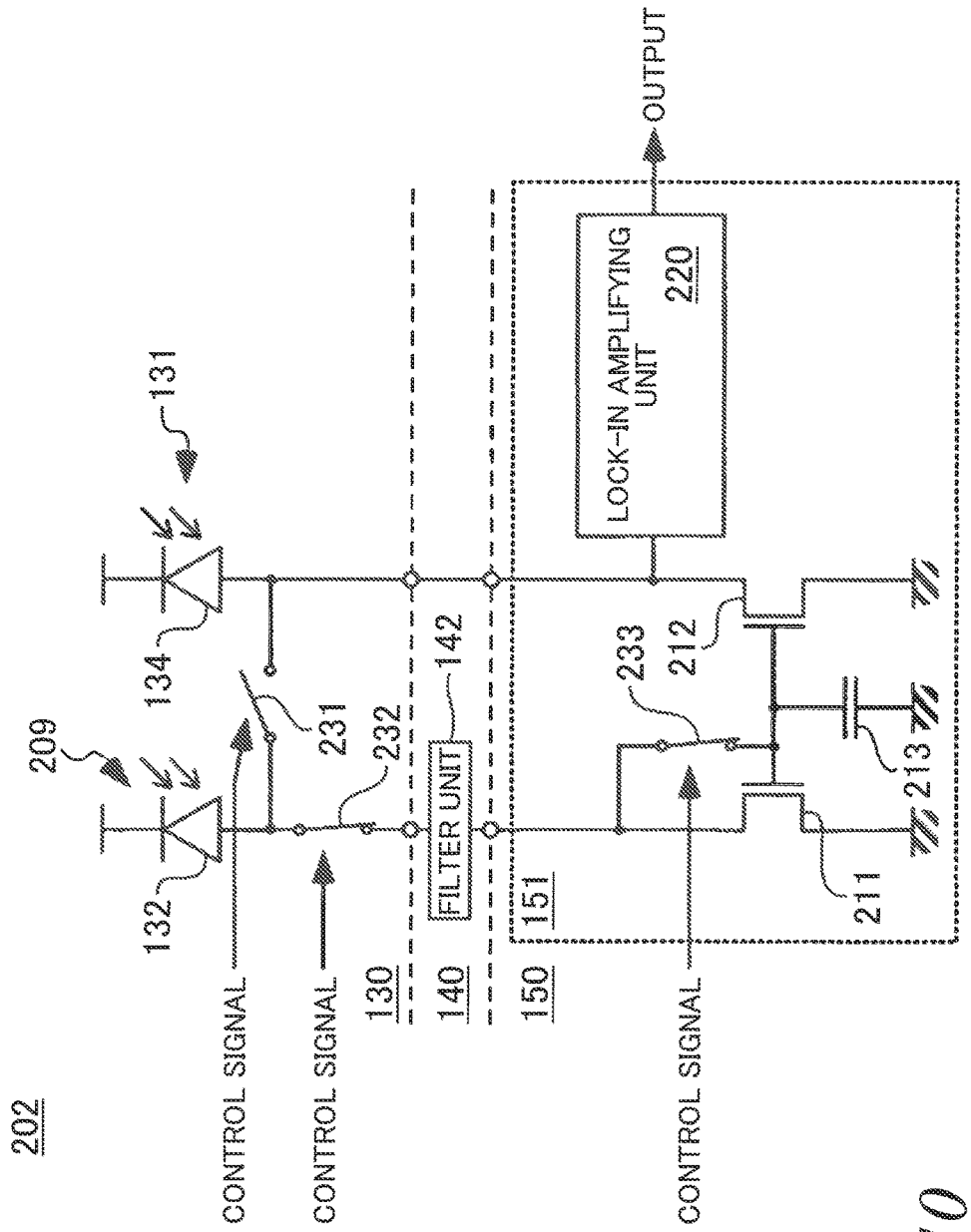
FIG. 10 is a partial schematic view of another modulation signal detecting unit 202.

FIG. 10 is a partial schematic view of another modulation signal detecting unit 202. The modulation signal detecting unit 202 has the same structure as the modulation signal detecting unit 201 shown in FIG. 3, except for the portion described next. Also, the modulation signal detecting unit 202 may be replaced with the modulation signal detecting unit 201 in the image capturing device 101. Thus, the same reference numeral is applied to the common element and redundant description is omitted.

The modulation signal detecting unit 202 is different from the modulation signal detecting unit 201 in including a plurality of switches 231, 232, 233. A first switch 231 is provided between the output of the sub pixel 132 and the output of the main pixel 134 to couple or disconnect both. In the illustrated state, the switch 231 is disconnected.

A second switch 232 is provided between the output of the sub pixel 132 and the input end of the filter unit 142 to couple or disconnect both. In the illustrated state, the switch 232 is coupled. Note that one end of the first switch 231 is connected to between the sub pixel 132 and the second switch 232. Thus, irrespective of whether the second switch 232 is in an opened or closed state, the one end of the first switch 231 is connected to the output of the sub pixel 132.

A third switch 233 is provided between the drain and the gate of the transistor 211 to couple or disconnect both. In the illustrated state, the switch 233 is coupled. The switches 231, 232, 233 can be opened or closed individually by a control signal.

If the switches 231, 232, 233 are in the illustrated state, each element of the modulation signal detecting unit 202 is connected in the same manner as the modulation signal detecting unit 201 shown in FIG. 3. Thus, the modulation signal detecting unit 202 is operated absolutely the same as the modulation signal detecting unit 201.

Note that in the image capturing device 101, the detection light receiving substrate 130 converts the incident light which enters through the image-capturing light receiving substrate 120 to an electrical signal. Thus, in the image capturing apparatus 300, it is preferable that the modulated light 331 output by the irradiating unit 330 should be of a bandwidth which facilitates transmission through the image-capturing light receiving substrate 120. In this regard, the modulated light 331 with which the irradiating unit 330 irradiates the subject 390 may be of an infrared bandwidth.

Also, if an infrared light is used as the modulated light 331, a light receiving element formed of a compound semiconductor such as InGaAs is used for the main pixel 134 and the sub pixel 132 to improve the sensitivity. As describe above, as the image capturing device 101 is formed by stacking the support substrate 160, the detection processing substrate 150, the detection light receiving substrate 130, the connecting substrate 140, the image-capturing light receiving substrate 120, and the optical element layer 110 which are individually prepared, the detection light receiving substrate 130 may be formed of substrate material different from that of other substrates.

Figure 11:
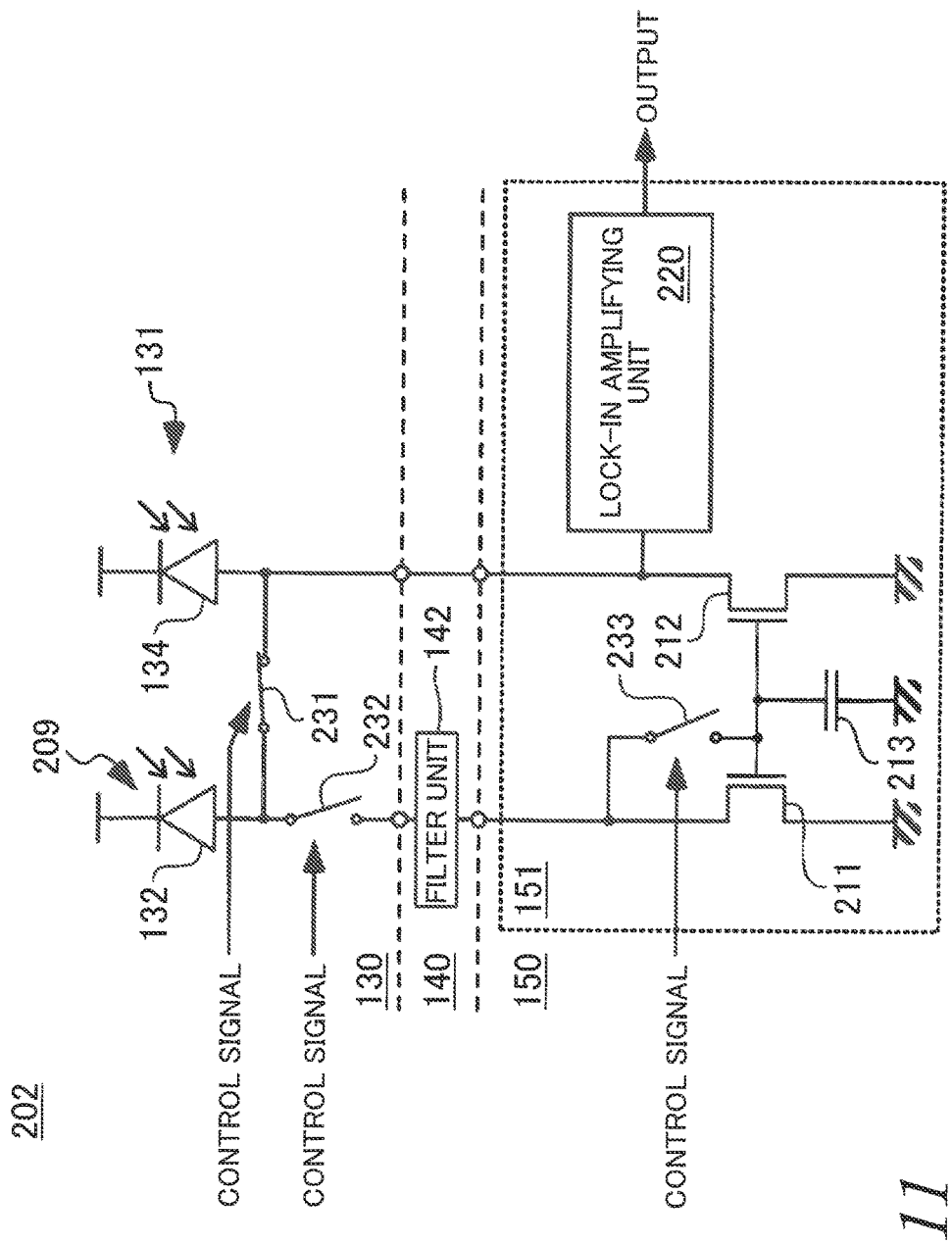
FIG. 11 is a schematic view showing a different state of the modulation signal detecting unit 202.

FIG. 11 is a schematic view showing a different state of the modulation signal detecting unit 202 shown in FIG. 10. In the illustrated state, the first switch 231 is coupled. Also, both of the second switch 232 and the third switch 233 are disconnected.

As a result, in the illustrated modulation signal detecting unit 202, both of the sub pixel 132 and the main pixel 134 are connected to the drain of one transistor 212 such that the other transistor 211 is in a state disconnected from any of the sub pixel 132 and the main pixel 134.

The modulation signal detecting unit 202 as described above is operated as follows. First, the switches 231, 232, 233 are put into the state shown in FIG. 10, and receive the incident light including the modulation component and the background light component. As described for the modulation signal detecting unit 201, this results in the state in which an electrical signal in which the background light component is removed or reduced is input to the lock-in amplifying unit 220.

Next, the control signal puts the switches 231, 232, 233 into the state shown in FIG. 11. In this state, the parasitic capacitance 213 which exists between the transistors 211, 212 is charged by the background light detecting unit 209. Therefore, even if the transistor 211 is decoupled, the gate voltage of the transistor 212 is clamped, thereby maintaining the state in which the background light component is removed or reduced in the electrical signal input to the lock-in amplifying unit 220. On the other hand, because the modulation signal detecting unit 202 receives the incident light from both of the sub pixel 132 and the main pixel 134 as a whole, the light receiving area is increased thereby improving the sensitivity.

Note that the switches 231, 232, 233 are connected as in the state shown in FIG. 10 at a predetermined period so that the gate voltage of the transistor 212 is updated and the background light component is removed in accordance with the actual situation. The varying period of the background light component is long enough to remove the background light component effectively, regardless of such an intermittent update.

Figure 12:
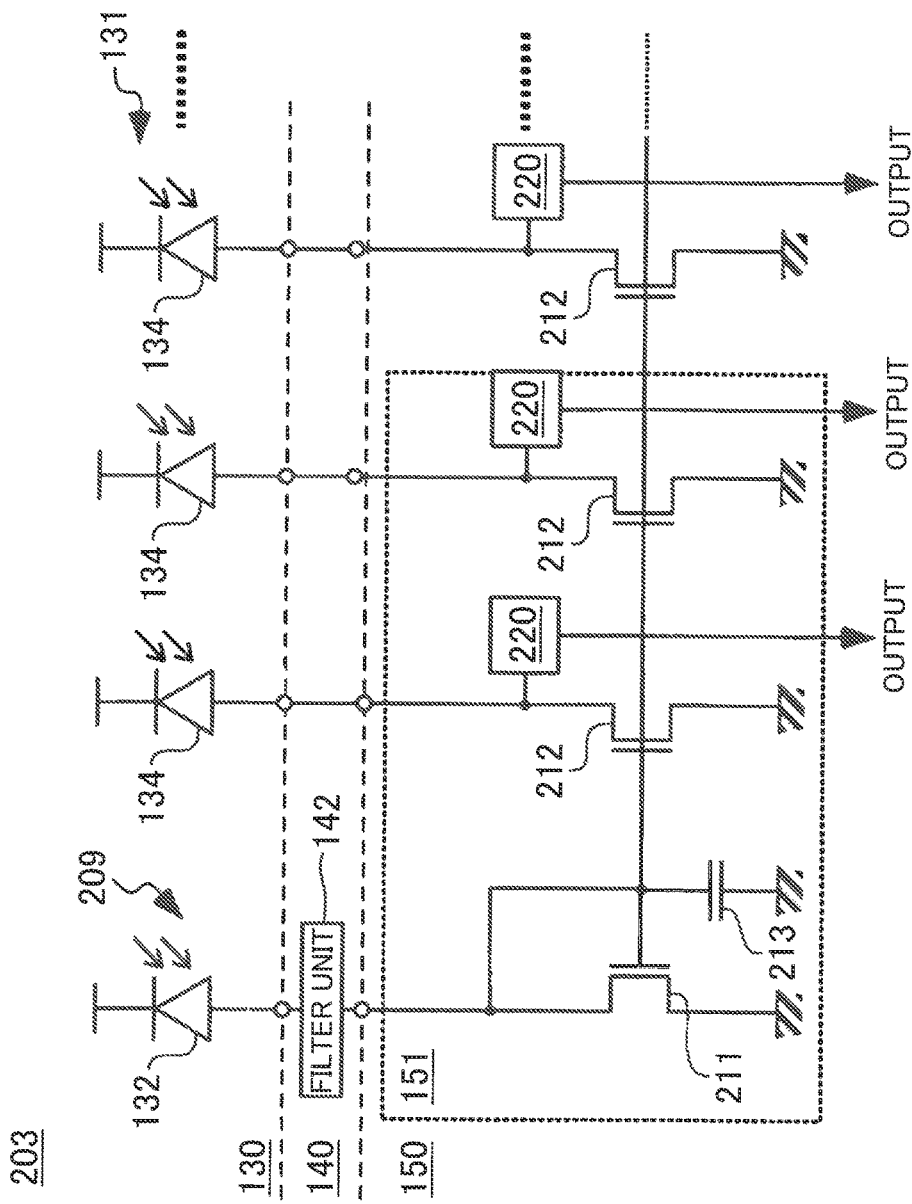
FIG. 12 is a partial schematic view of another modulation signal detecting unit 203.

FIG. 12 is a partial schematic view of another modulation signal detecting unit 203. The modulation signal detecting unit 203 has the same structure as the modulation signal detecting unit 201 shown in FIG. 3, except for the portion described next. Also, the modulation signal detecting unit 203 may be replaced with the modulation signal detecting unit 201 in the image capturing device 101. Thus, the same reference numeral is applied to the common element and redundant description is omitted.

The modulation signal detecting unit 203 is different from the modulation signal detecting unit 201 in a plurality of main pixels 134 connected to the background light detecting unit 209 including a single sub pixel 132. The transistor 212 and the lock-in amplifying unit 220 are connected to each of a plurality of main pixels 134. The gate of the transistor 211 of the background light detecting unit 209 is connected to the gate of a plurality of transistors 212. As a result, in the image capturing device 101 as a whole, the number of background light detecting units 209 can be reduced, thereby reducing the circuit scale of the detection processing substrate 150.

In the examples shown in FIG. 3 to FIG. 11, exemplary cases are illustrated in which two pixels, the main pixel 134 and the sub pixel 132, are used. However, the sub pixel 132 may not be used. In this case, electrical signals indicating currents output from the main pixel 134 are converted to a voltage by a current-voltage converting circuit including an op-amp and a resistance, and subsequently electrical signals indicating the voltage are branched. From one of the branched electrical signals, a voltage value is extract corresponding to the background light component via the filter unit such as a low pass filter. From the other of the branched electrical signals, electrical signals indicating a voltage value corresponding to the modulated light component are extracted, where the voltage value results from a voltage value of signals not via the filter unit, that is, a voltage value including both of the modulated light component and the background light component from which a voltage value corresponding to the background light component is subtracted by using the op-amp.

Figure 13:
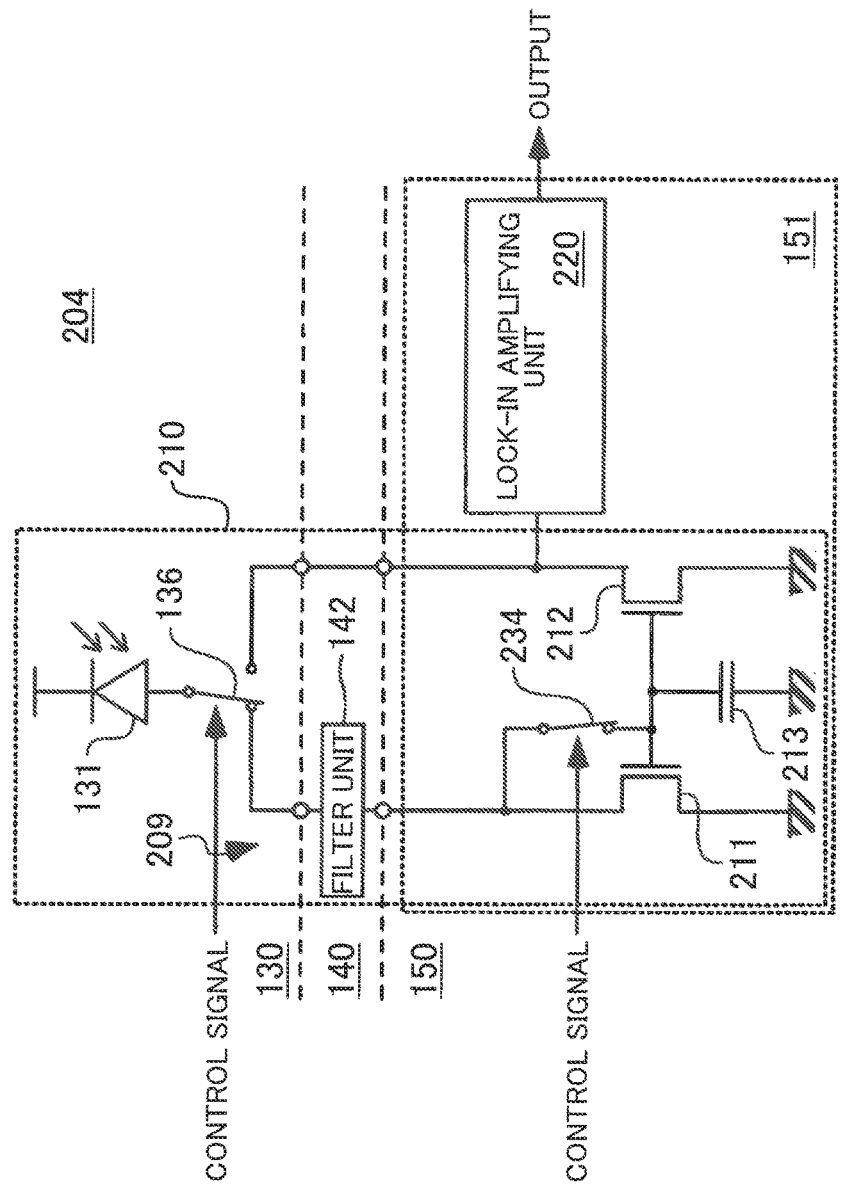
FIG. 13 is a schematic view of the modulation signal detecting unit 204.

FIG. 13 is a schematic view of the modulation signal detecting unit 204. The modulation signal detecting unit 204 has the same structure as the modulation signal detecting unit 201 shown in FIG. 3, except for the portion described next. Also, the modulation signal detecting unit 204 may be replaced with the modulation signal detecting unit 201 in the image capturing device 101. Thus, the same reference numeral is applied to the common element and redundant description is omitted.

The modulation signal detecting unit 204 includes a single detection light receiving elements 131, a switching unit 136 and a switch 234, instead of the sub pixel 132 and the main pixel 134. The switching unit 136 selectively connects the output of the detection light receiving elements 131 to the drain of either the transistor 211 or 212. The switch 234 couples or disconnects the drain and the gate of the transistor 211 provided at the side of the background light detecting unit 209.

In the illustrated state, the switching unit 136 connects the output of the detection light receiving elements 131 to the transistor 211. Also, the switch 234 makes the drain and the gate of the transistor 211 shorted. Thus, a current from which the modulation component is removed or reduced by the filter unit 142 flows through the transistor 211. As a result, a current in which the modulation component is reduced also flows through the transistor 212 which forms the transistor 211 and the current mirror circuit. Also, the parasitic capacitance 213 between the transistors 211, 212 is charged.

Figure 14:
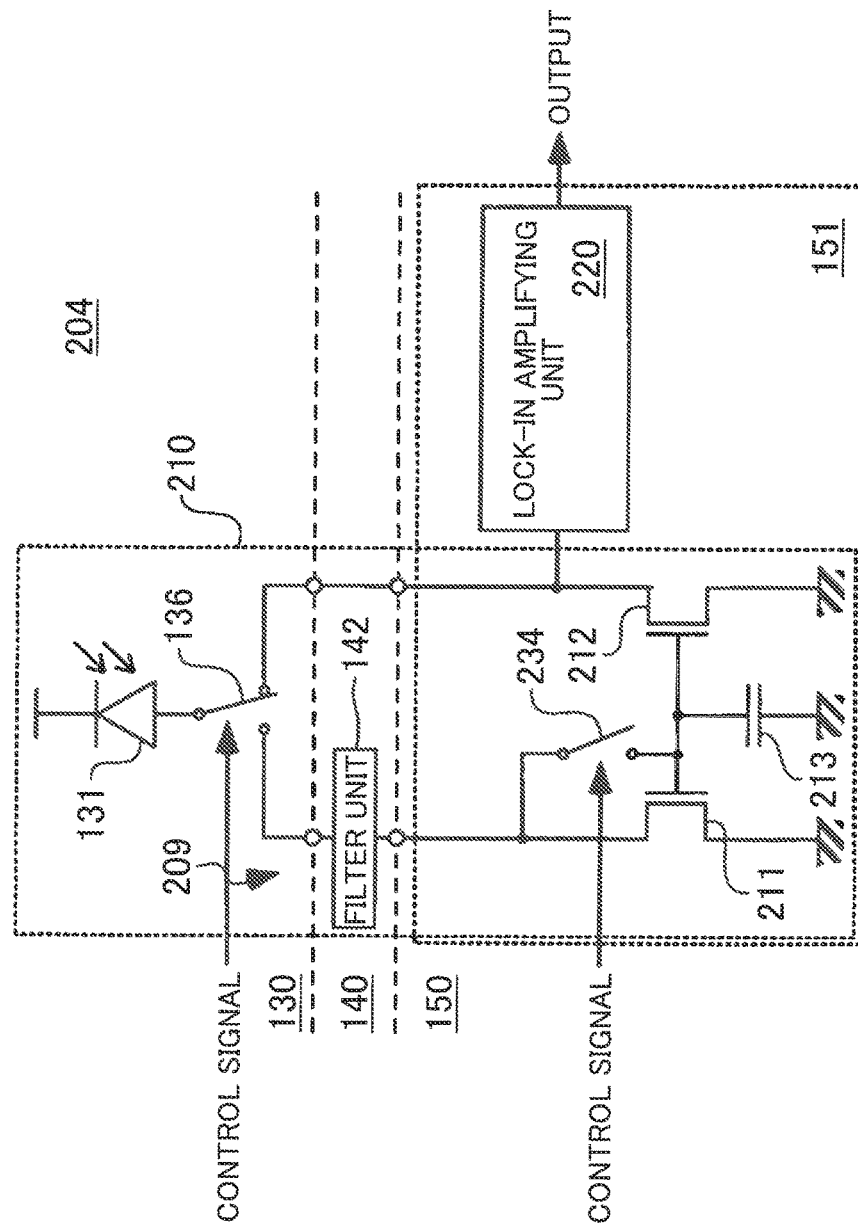
FIG. 14 is a schematic view showing another state of the modulation signal detecting unit 204.

FIG. 14 is a schematic view showing another state of the modulation signal detecting unit 204. In the illustrated state following the state shown in FIG. 13, the control signal switches the switching unit 136 and the switch 234. This allows the output of the detection light receiving elements 131 to be connected to the input of the lock-in amplifying unit 220 and the drain of the transistor 212. Also, the drain and the gate of the transistor 211 are disconnected. Thus, the filter unit 142 and the transistor 211 are decoupled from the detection light receiving elements 131. However, the parasitic capacitance 213 has already been charged. Therefore, even if the transistor 211 is decoupled, the gate voltage of the transistor 212 is clamped, thereby maintaining the state in which the background light component is removed or reduced in the electrical signal input to the lock-in amplifying unit 220.

Figure 15:
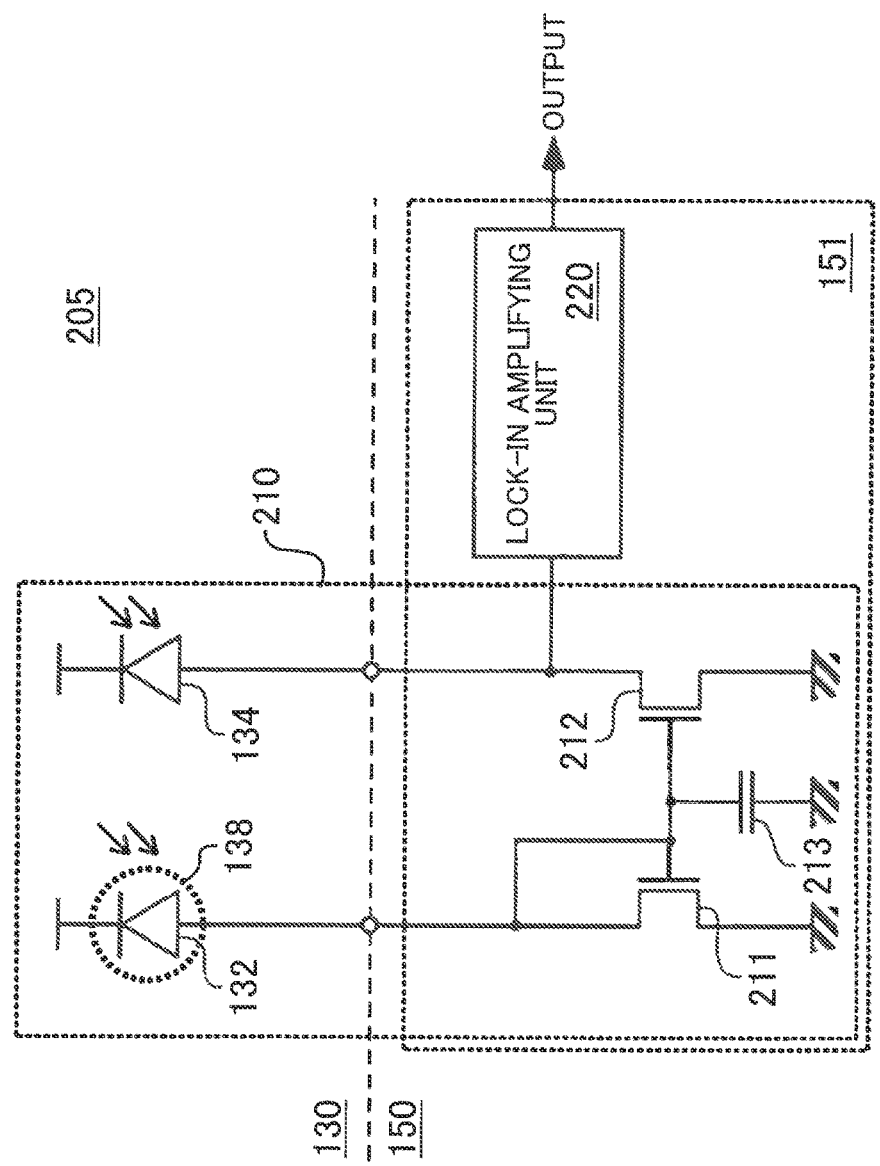
FIG. 15 is a schematic view of the modulation signal detecting unit 205.

FIG. 15 is a schematic view of still another modulation signal detecting unit 205. The modulation signal detecting unit 205 has the same structure as the modulation signal detecting unit 201 shown in FIG. 3, except for the portion described next. Also, the modulation signal detecting unit 205 may be replaced with the modulation signal detecting unit 201 in the image capturing device 101. Thus, the same reference numeral is applied to the common element and redundant description is omitted.

The modulation signal detecting unit 205 is different from the modulation signal detecting unit 201 in the sub pixel 132 including an optical filter 138. The optical filter 138 has a characteristic to block or reduce a light having a wavelength of the modulated light component in the incident light entering the sub pixel 132. Thus, the modulated light component has already been reduced in the current signal output from the sub pixel 132 which receives the incident light.

This allows the filter unit 142 to be omitted. It should be appreciated that, however, the optical filter 138 and the filter unit 142 which is an electrical filter may also be used in combination. This allows a rapid block characteristic which cannot be obtained from the optical filter 138 or the electrical filter unit 142 alone to reduce the modulated light component.

The optical filter 138 may be embedded in, for example, an on-chip color filter 112 of the image capturing device 101. Also, the modulated light 331 of a bandwidth to be removed by the on-chip color filter 112 may be used as the modulated light 331.

Also, as the optical filter, a luminous paint may be used which is applied to a member through which the incident modulated light 331 is transmitted. The luminous paint substantially works as a low pass filter by accumulating the incident lights of a particular bandwidth.

Figure 16:
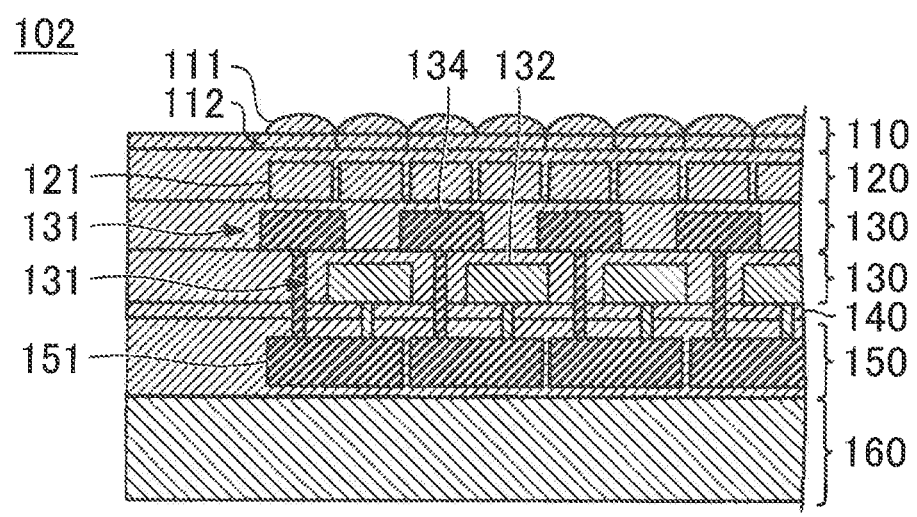
FIG. 16 is a schematic cross sectional view of another image capturing device 102.

FIG. 16 is a schematic cross sectional view of another image capturing device 102. The image capturing device 102 has the same structure as the image capturing device 101 shown in FIG. 1, except for the portion described next. Thus, the same reference numeral is applied to the common element and redundant description is omitted.

The image capturing device 102 is different from the image capturing device 101 in including two detection light receiving substrates 130. Two detection light receiving substrates 130 are stacked one above the other and provided between the image-capturing light receiving substrate 120 and the connecting substrate 140.

Each of two detection light receiving substrates 130 includes a plurality of detection light receiving elements 131 spaced from one another. The arrangement intervals of the detection light receiving elements 131 of each of the detection light receiving substrates 130 are equal to one another. However, the positions of the detection light receiving elements 131 of one detection light receiving substrate 130 are not aligned with those of the other detection light receiving substrate 130. Thus, if two detection light receiving substrates 130 are stacked, each detection light receiving element 131 does not block the incident light to enter the other detection light receiving element 131 so that the detection light receiving elements 131 of the detection light receiving substrate 130 at the lower side in the figure receive the incident lights through the detection light receiving substrate 130 at the upper side in the figure.

In the image capturing device 102, the detection light receiving elements 131 provided in one detection light receiving substrate 130 provided at the upper side in the figure are connected to the detecting circuit 151 of the detection processing substrate 150 as the main pixel 134. Also, the detection light receiving elements 131 provided in the other detection light receiving substrate 130 provided at the lower side in the figure are connected to the detecting circuit 151 of the detection processing substrate 150 as the sub pixel 132. This can improve incident efficiency to the main pixel 134 which contributes detection of the modulated light 331.

In this manner, in the image capturing device 102, the main pixel 134 as a first photoelectric converting unit and the sub pixel 132 as a second converting unit may be provided on different substrates, respectively, the substrates then may be stacked one above the other, and each pixel may receive the incident light.

Figure 17:
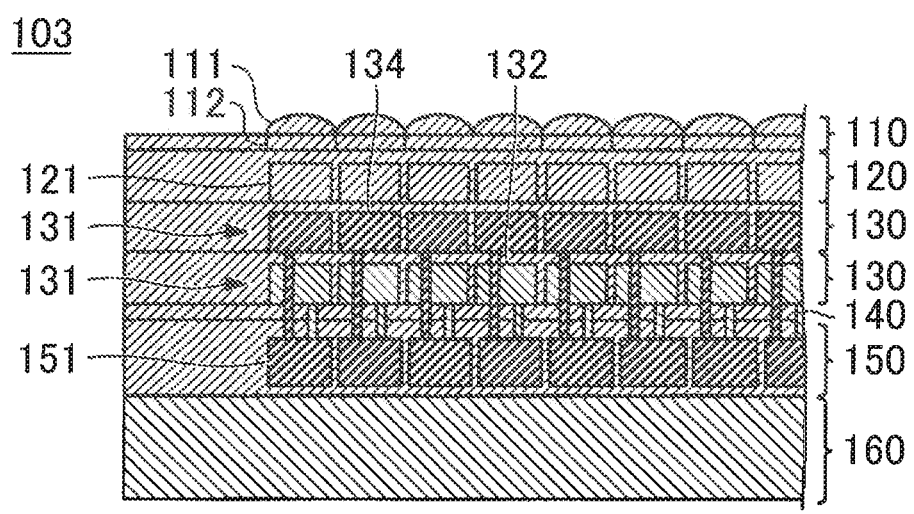
FIG. 17 is a schematic cross sectional view of another image capturing device 103.

FIG. 17 is a schematic cross sectional view of still another image capturing device 103. The image capturing device 103 has the same structure as the image capturing device 101 shown in FIG. 1, except for the portion described next. Thus, the same reference numeral is applied to the common element and redundant description is omitted.

The image capturing device 103 has the same structure as the image capturing device 102 shown in FIG. 16 in including two detection light receiving substrates 130. Also, the main pixel 134 is provided in the detection light receiving substrate 130 at the upper side in the figure while the sub pixel 132 is formed in the detection light receiving substrate 130 at the lower side in the figure, which is also the same structure as the image capturing device 102 shown in FIG. 16.

On the other hand, the image capturing device 103 is different from the image capturing device 102 in the main pixel 134 and the sub pixel 132 provided approximately adjacent to each other in two detection light receiving substrates 130. As a result, in the image capturing device 103, the main pixel 134 and the sub pixel 132 are arranged to be overlapped in an incident direction of the incident light to be received. Thus, the main pixel 134 and the sub pixel 132 receive the incident light at the same position with respect to each other.

In this manner, in the image capturing device 103, the sub pixel 132 may receive the incident light transmitted through the main pixel 134. This results in the main pixel 134 and the sub pixel 132 provided with the same density as the image-capturing light receiving elements 121. Thus, in the image capturing device 103, an image including distance information can be captured for each pixel.

Figure 18:
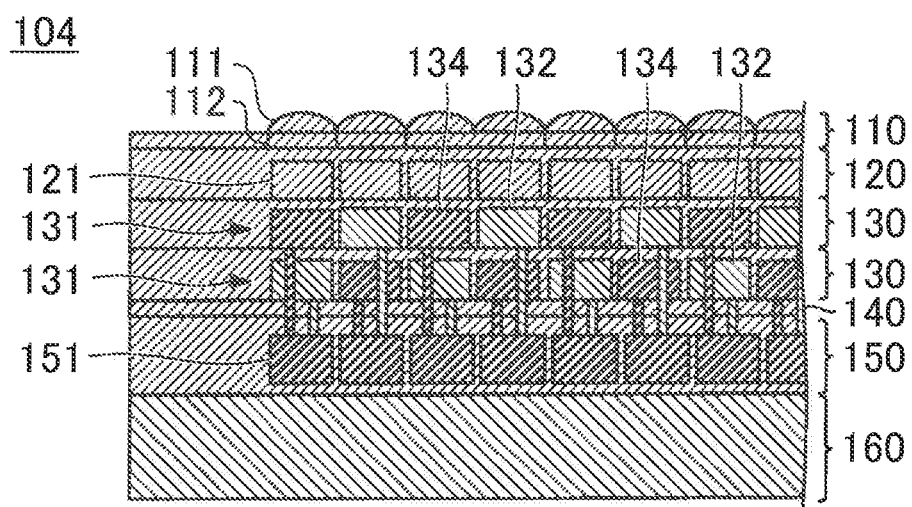
FIG. 18 is a schematic cross sectional view of another image capturing device 104.

FIG. 18 is a schematic cross sectional view of another image capturing device 104. The image capturing device 104 has the same structure as the image capturing device 103 shown in FIG. 17, except for the portion described next. Thus, the same reference numeral is applied to the common element and redundant description is omitted.

In the image capturing device 104, each of two detection light receiving substrates 130 includes the sub pixels 132 and the main pixels 134 which are provided alternately. Also, an arrangement of the sub pixels 132 and the main pixels 134 of the upper detection light receiving substrate 130 and that of the lower detection light receiving substrate 130 are shifted by one pixel from each other. This allows in the image capturing device 104, the stacking order of the main pixel 134 and the sub pixel 132 in a vertical direction is switched alternately.

In this manner, in the image capturing device 104, the main pixel 134 and the sub pixel 132 exist in each of two detection light receiving substrates 130 in a mixed state. Also, in the image capturing device 104, the main pixel 134 and the sub pixel 132 receive the incident light at the same position corresponding to each other. This can resolve imbalance of light receiving efficiency between the sub pixel and the main pixel 134 which results from the sub pixel 132 receiving a light through the main pixel 134.

Figure 19:
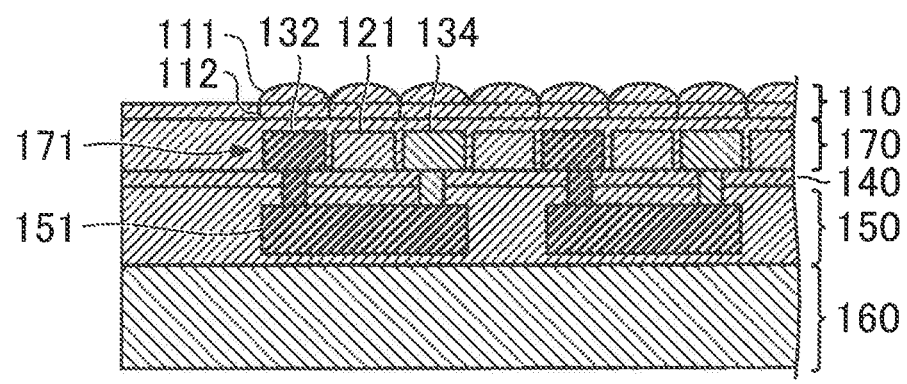
FIG. 19 is a schematic cross sectional view of another image capturing device 105.

FIG. 19 is a schematic cross sectional view of another image capturing device 105. The image capturing device 105 has the same structure as the image capturing device 101 shown in FIG. 1, except for the portion described next. Thus, the same reference numeral is applied to the common element and redundant description is omitted.

The image capturing device 105 is different from the image capturing device 105 in including an integrated light receiving substrate 170 in which the image-capturing light receiving substrate 120 and the detection light receiving substrate 130 are integrated. This can reduce the number of layers of substrates to form the image capturing device 105 and also reduce manufacturing cost.

Figure 20:
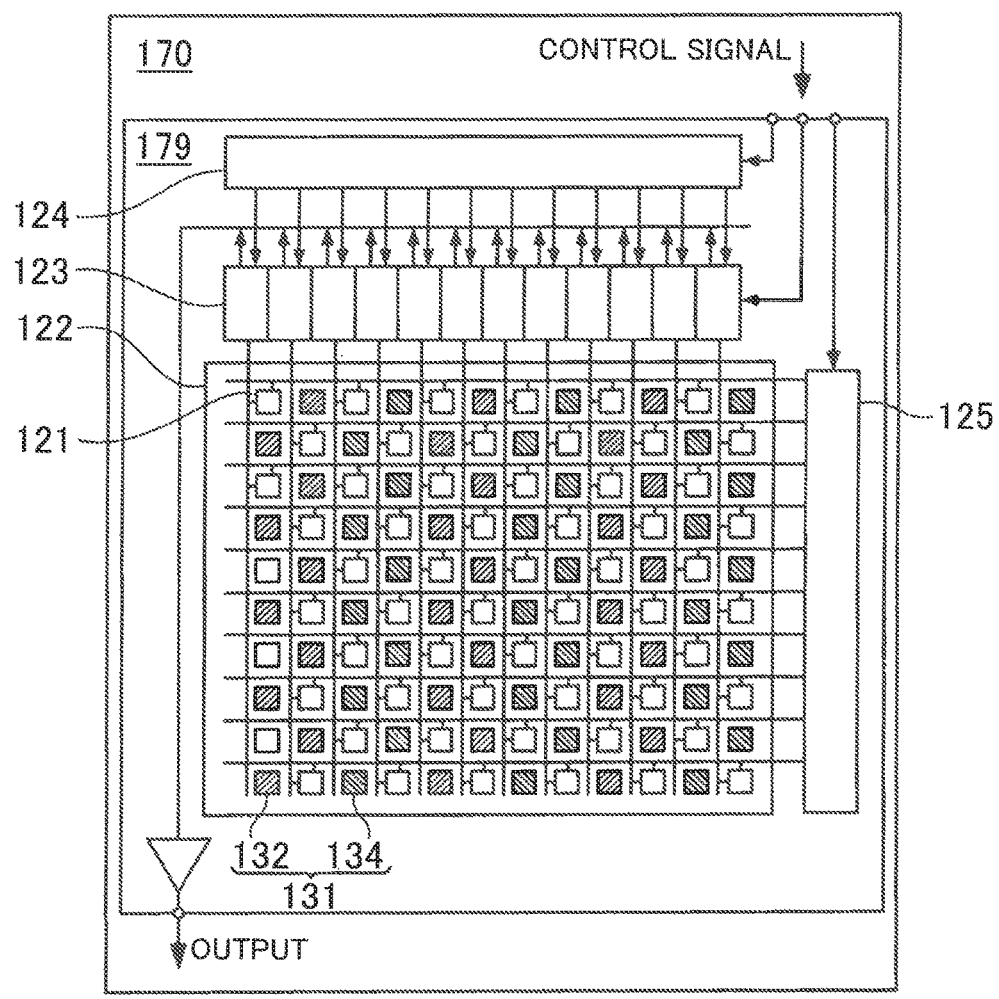
FIG. 20 is a schematic plan view of a CMOS sensor unit 179.

FIG. 20 is a schematic plan view showing an arrangement of light receiving elements in a CMOS sensor unit 179 formed on the integrated light receiving substrate 170. Note that the CMOS sensor unit 179 of the integrated light receiving substrate 170 has the same structure as the CMOS sensor unit 129 shown in FIG. 2, except for the portion described next. Thus, the same reference numeral is applied to the common element and redundant description is omitted.

In the CMOS sensor unit 179 of the integrated light receiving substrate 170, the image-capturing light receiving elements 121 and the detection light receiving elements 131 including the sub pixels 132 and the main pixels 134 are arrayed repeatedly in one substrate to form a sensor array 122. Here, the image-capturing light receiving elements 121 are connected to the column signal processing circuit 123, the horizontal driving circuit 124, and the vertical driving circuit 125 to form a CMOS sensor for image capturing.

On the other hand, the detection light receiving elements 131 output the outputs of the light receiving elements directly to the detecting circuit 151 of the detection processing substrate 150. Therefore, the detection light receiving elements 131 are not connected to the column signal processing circuit 123, the horizontal driving circuit 124, or the vertical driving circuit 125 on the integrated light receiving substrate 170.

Note that in the example described above, the sub pixel 132 and the main pixel 134 are dedicated to detecting the modulated light. However, by switching connection of the gate from being connected to the main pixel 134 in the modulated light detecting unit 210 to the GND voltage and switching the reference signal 224 of the lock-in amplifying unit 220 to the direct current voltage, the main pixel 134 can also be used as a part of the image-capturing light receiving elements 121.

In this case, signals from the image-capturing light receiving elements 121 which are the main pixels 134 may be output to both of the image generating unit including a processing circuit to form an image and the detecting unit including the detecting circuit 151, or may be output to the image generating unit and the detecting unit selectively. A switching unit may also be provided to switch output destinations from the main pixels 134. Also, the image generating unit described above and the detecting unit described above may be provided on different substrates from each other and they are stacked one above the other.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A light detecting apparatus comprising:
a photoelectric converting element which outputs a first electrical signal in accordance with an incident light including a modulated light component and a background light component;
a filter which outputs a second electrical signal resulting from a signal corresponding to the modulated light component being attenuated in the first electrical signal; and
a signal processor which subtracts the second electrical signal from the first electrical signal to reduce a signal corresponding to the background light component in the first electrical signal, wherein:
the photoelectric converting element includes a first photoelectric converting element and a second photoelectric converting element each of which outputs the first electrical signal,
the filter attenuates the signal corresponding to the modulated light component in the first electrical signal output from the second photoelectric converting element, and
the signal processor subtracts the second electrical signal from the first electrical signal output from the first photoelectric converting element.

2. The light detecting apparatus according to claim 1, comprising:
a first substrate provided with the second photoelectric converting element; and
a second substrate stacked on the first substrate and provided with the signal processor, wherein
the filter is electrically connected to the second photoelectric converting element, and includes a capacitative element formed on at least one of the first substrate and the second substrate.

3. The light detecting apparatus according to claim 2, wherein the first substrate includes a light receiving substrate provided with the second photoelectric converting element and a connecting substrate stacked on the light receiving substrate, wherein the capacitative element is provided to penetrate through the connecting substrate.

4. The light detecting apparatus according to claim 1, wherein the first photoelectric converting element and the second photoelectric converting element are provided on a common substrate.

5. The light detecting apparatus according to claim 1, comprising a first substrate provided with the first photoelectric converting element and a third substrate stacked on the first substrate and provided with the second photoelectric converting element.

6. The light detecting apparatus according to claim 5, wherein the second photoelectric converting element receives the incident light through the first substrate.

7. The light detecting apparatus according to claim 5, wherein the second photoelectric converting element receives the incident light through the first photoelectric converting element.

8. The light detecting apparatus according to claim 1, wherein
the first electrical signal and the second electrical signal are current signals, respectively, and
the signal processor subtracts a current value of the second electrical signal from a current value of the first electrical signal.

9. The light detecting apparatus according to claim 8, wherein the signal processor includes a current mirror circuit having a first transistor electrically connected to the photoelectric converting element and a second transistor electrically connected to the filter.

10. The light detecting apparatus according to claim 1, comprising a switch which selectively connects the photoelectric converting element to either a wiring connected to the signal processor via the filter or a wiring connected to the signal processor not via the filter.

11. An image capturing apparatus comprising the light detecting apparatus according to claim 1 and an image formation optical system which causes the light detecting apparatus to form an image with an imaging light.

12. A light detecting apparatus comprising:
a photoelectric converting element which outputs a first electrical signal in accordance with an incident light including a modulated light component and a background light component;
a filter which outputs a second electrical signal resulting from a signal corresponding to the modulated light component being attenuated in the first electrical signal;
a signal processor which subtracts the second electrical signal from the first electrical signal to reduce a signal corresponding to the background light component in the first electrical signal;
a first substrate on which a first photoelectric converting element receiving the incident light in the photoelectric converting unit and a second photoelectric converting element receiving the incident light in the filter are provided in common; and
a second substrate on which the first photoelectric converting element receiving the incident light in the photoelectric converting element and the second photoelectric converting element receiving the incident light in the filter are provided in common, and which is stacked on the first substrate.

13. The light detecting apparatus according to claim 12, wherein
the second photoelectric converting element of the second substrate is provided at a position corresponding to the first photoelectric converting element of the first substrate, and
the first photoelectric converting element of the second substrate is provided at a position corresponding to the second photoelectric converting element of the first substrate.

14. A light detecting apparatus comprising:
a photoelectric converting element which outputs a first electrical signal in accordance with an incident light including a modulated light component and a background light component;
a filter which outputs a second electrical signal resulting from a signal corresponding to the modulated light component being attenuated in the first electrical signal; and
a signal processor which subtracts the second electrical signal from the first electrical signal to reduce a signal corresponding to the background light component in the first electrical signal,
wherein the filter includes an optical filter which optically reduces the modulated light component entering the filter.

15. A light detecting apparatus comprising:
a photoelectric converting element which outputs a first electrical signal in accordance with an incident light including a modulated light component and a background light component;

a filter which outputs a second electrical signal resulting from the modulated light component being reduced in the incident light; and a signal processor which subtracts the second electrical signal from the first electrical signal to reduce a component corresponding to the background light component in the first electrical signal, wherein the filter includes an optical filter which optically reduces the modulated light component entering the filter.

16. The light detecting apparatus according to claim 15, wherein the filter which electrically reduces a component corresponding to the modulated light component in the incident light.

17. An image sensor comprising:

a photoelectric converting element which outputs a first electrical signal in accordance with an incident light including a modulated light component and a background light component;

a filter which outputs a second electrical signal resulting from a signal corresponding to the modulated light component being attenuated in the first electrical signal; and a signal processor which subtracts the second electrical signal from the first electrical signal to reduce a signal corresponding to the background light component in the first electrical signal, wherein:

the photoelectric converting element includes a first photoelectric converting element and a second photoelectric converting element each of which outputs the first electrical signal, the filter attenuates the signal corresponding to the modulated light component in the first electrical signal output from the second photoelectric converting element, and the signal processor subtracts the second electrical signal from the first electrical signal output from the first photoelectric converting element.

18. An image sensor comprising:

a photoelectric converting element which outputs a first electrical signal in accordance with an incident light including a modulated light component and a background light component;

a filter which outputs a second electrical signal resulting from the modulated light component being reduced in the incident light; and a signal processor which subtracts the second electrical signal from the first electrical signal to reduce a signal corresponding to the background light component in the first electrical signal, wherein:

the photoelectric converting element includes a first photoelectric converting element and a second photoelectric converting element each of which outputs the first electrical signal, the filter attenuates the signal corresponding to the modulated light component in the first electrical signal output from the second photoelectric converting element, and the signal processor subtracts the second electrical signal from the first electrical signal output from the first photoelectric converting element.

* * * * *